United States Patent [19]

Wong

[11] Patent Number: 5,268,821
[45] Date of Patent: Dec. 7, 1993

[54] SHARED PC BOARD EJECTOR/INJECTOR TOOL

[75] Inventor: Steven J. Wong, Sunnyvale, Calif.

[73] Assignee: Tandem Computers Incorporated, Cupertino, Calif.

[21] Appl. No.: 971,695

[22] Filed: Nov. 4, 1992

Related U.S. Application Data

[63] Continuation of Ser. No. 665,399, Mar. 6, 1991, abandoned.

[51] Int. Cl.[5] .......................... H05K 7/12; H05K 7/14; H01R 13/62
[52] U.S. Cl. ........................ 361/796; 211/41; 361/752; 439/152; 439/160
[58] Field of Search ............... 211/41; 361/388, 389, 361/399, 412, 413, 415; 439/152, 153, 155, 157, 160

[56] References Cited

U.S. PATENT DOCUMENTS

| | | | |
|---|---|---|---|
| 2,976,510 | 3/1961 | Blain | 439/152 |
| 3,271,626 | 9/1966 | Howrilka | 211/41 |
| 3,360,689 | 12/1967 | Haury | 439/152 |
| 3,476,258 | 11/1969 | Dorsett | 211/41 |
| 3,952,232 | 4/1976 | Coules . | |
| 4,064,551 | 12/1977 | Lightfoot . | |
| 4,233,646 | 11/1980 | Leung et al. | 361/399 |
| 4,301,494 | 11/1981 | Jordan | 361/415 |
| 4,313,150 | 1/1982 | Chu . | |
| 4,375,856 | 3/1983 | Chappot | 211/41 |
| 4,632,588 | 12/1986 | Fitzpatrick . | |
| 4,638,405 | 1/1987 | Smith | 361/415 |
| 4,648,009 | 3/1987 | Beun et al. . | |
| 4,698,024 | 10/1987 | Maxwell | 439/160 |
| 4,702,535 | 10/1987 | Beun | 361/415 |
| 4,780,792 | 10/1988 | Harris et al. | 211/41 |
| 4,783,720 | 11/1988 | Joist et al. . | |
| 4,798,923 | 1/1989 | Barwick et al. . | |
| 4,875,867 | 10/1989 | Hoo . | |
| 4,914,552 | 4/1990 | Kecmer | 211/41 |
| 4,996,631 | 2/1991 | Freehauf | 361/415 |

FOREIGN PATENT DOCUMENTS 2730809 1/1978 Fed. Rep. of Germany ...... 361/415

Primary Examiner—Leo P. Picard
Assistant Examiner—Donald A. Sparks
Attorney, Agent, or Firm—Townsend and Townsend Khourie and Crew

[57] ABSTRACT

A tool (10) inserts and removes printed circuit boards (55) from a card cage (50) holding a plurality of such boards. The tool (10) has a guide (20), mounted on the card cage, a slider (30) slidably mounted to the guide, and lever arm (40), pivotally mounted to the slider. One tool can thus service all the printed circuit boards (55) in a card cage (50).

10 Claims, 2 Drawing Sheets

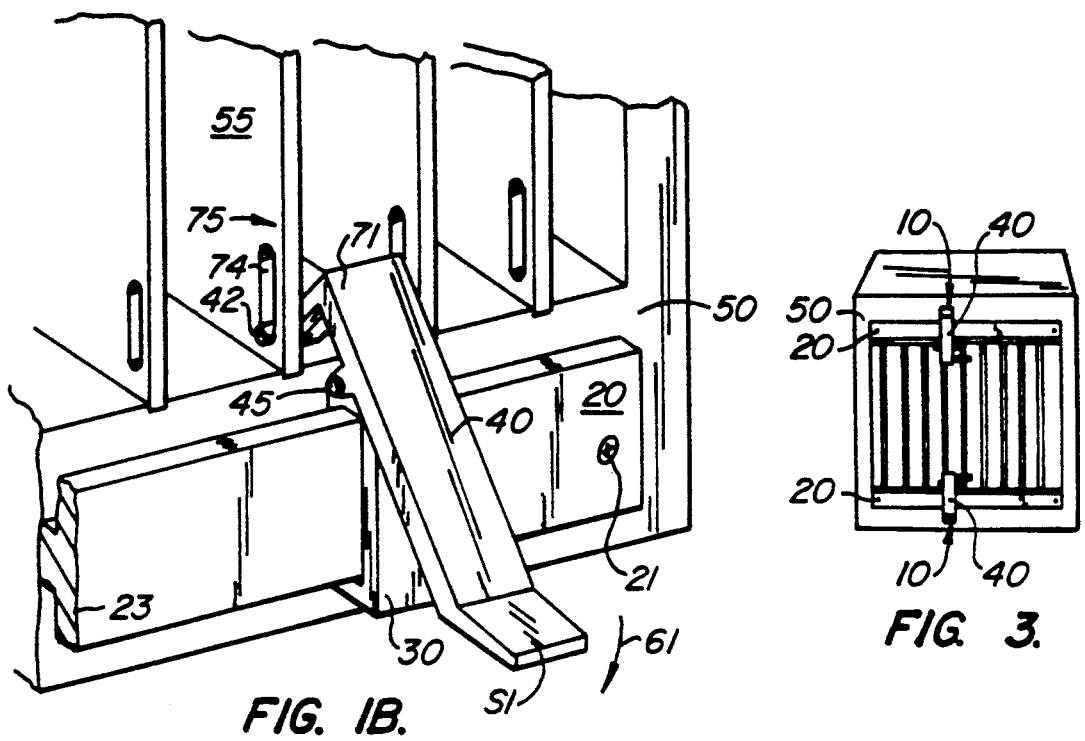
FIG. 1B.
FIG. 3.
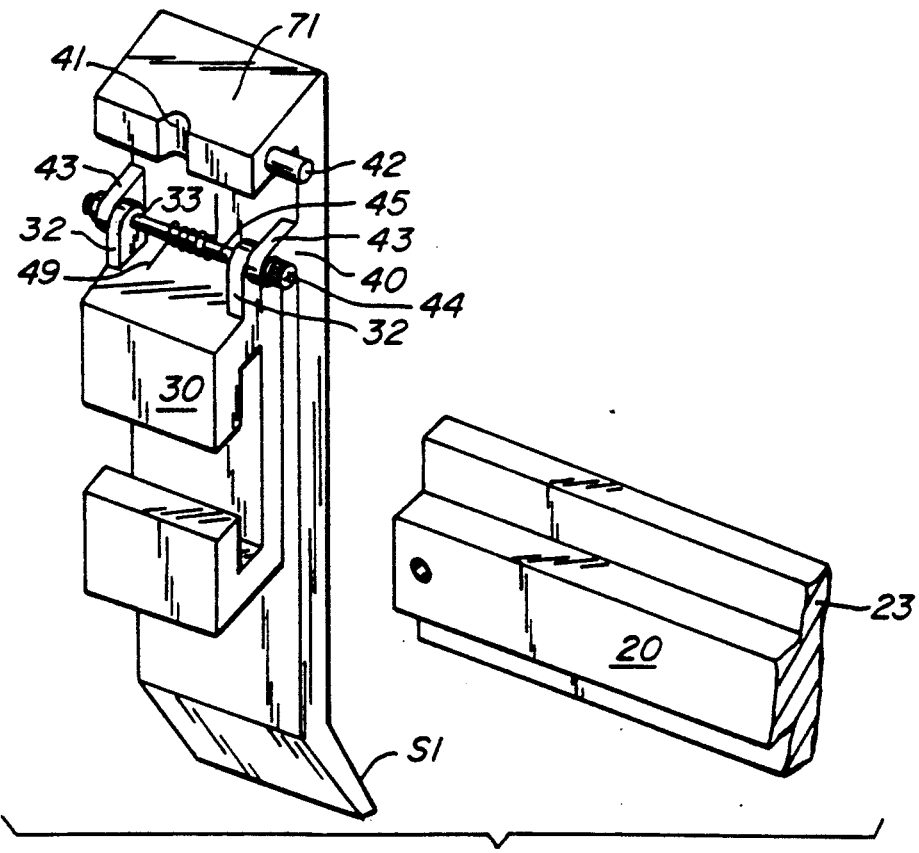
FIG. 2.

SHARED PC BOARD EJECTOR/INJECTOR TOOL

This is a continuation of application Ser. No. 07/665,399, filed Mar. 6, 1991, now abandoned.

BACKGROUND OF THE INVENTION

The present invention relates to insertion/removal tools used to install and remove individual printed circuit ('PC') boards into and from a card cage holding a plurality of PC boards.

Tools for installing and removing PC boards in and from a card cage holding a plurality of PC boards are known. These tools consist of levers mounted on either the card cage or the individual PC boards, the levers either pushing the PC boards into place or pulling them from the card cage when the levers are pivoted about their fixed axis of rotation. At present, at least one lever is permanently attached to either the PC board or the card cage assembly at the location where the PC board is inserted. It is also known to mount and use two such tools for each PC board. Although the tools currently in use function adequately, the necessity of providing at least one separate tool to insert and remove each PC board in a card cage is expensive and cumbersome.

SUMMARY OF THE INVENTION

The present invention comprises an insertion/removal tool for inserting and removing PC boards from a card cage. The tool mounts on and travels along a rail, the rail being mounted on the front of the card cage. Thus, one tool can be used to insert and remove a plurality of PC boards. Insertion or removal of a PC board is accomplished by sliding the tool in front of the selected PC board and then pulling up on the tool's lever arm, the lever arm pivoting about the slider assembly.

With the present invention, only one insertion/removal tool is needed to insert or remove any one of a plurality of PC boards from a card cage. This contrasts with known insertion/removal tools, which are dedicated to operate with individual PC boards.

The tool will now be described in detail with reference to the figures listed and described below:

BRIEF DESCRIPTION OF THE DRAWINGS

FIG. 1B shows the present invention mounted on a card cage holding a plurality of PC boards and being used to remove a PC board;

FIG. 2 illustrates the components of the present invention; and

FIG. 3 shows how two of the tools taught by the present invention can be used cooperatively to insert or remove a single PC board.

DESCRIPTION OF THE SPECIFIC EMBODIMENT(S)

Figure 1A:
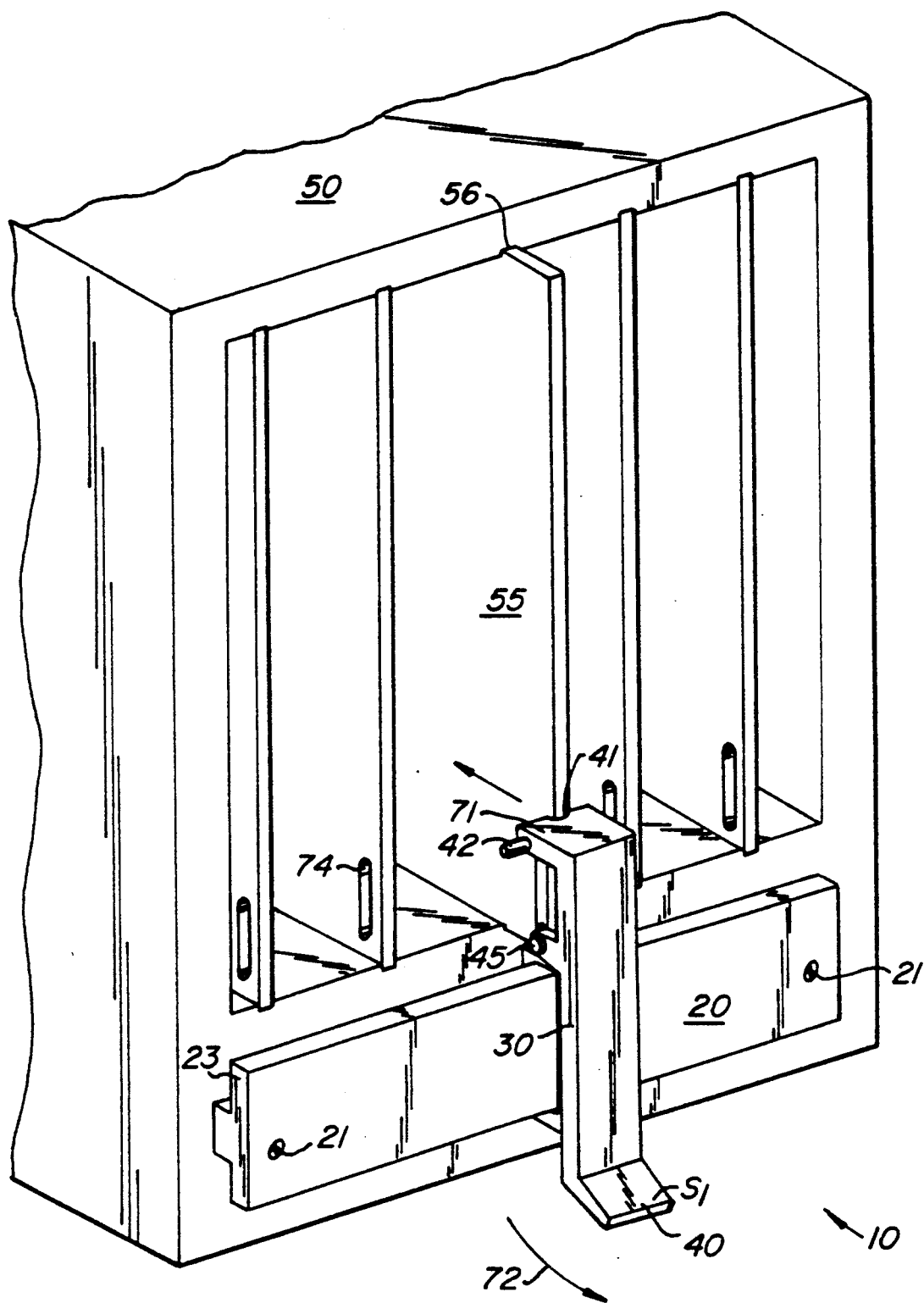
FIG. 1A shows the present invention mounted on a card cage holding a plurality of PC boards and being used to insert a PC board.

As shown in FIGS. 1A and 2, tool 10, in a preferred embodiment, comprises a guide 20, a slider 30, and a rotating arm 40. In the preferred embodiment these parts are made of a plastic having the necessary tensile strength. The length of guide 20 is dependent on the size of card cage 50. Guide 20 is fixed to card cage 50, either above or below PC boards 55 by means of flathead screws 21, positioned every six inches along the midsection of the guide. Flathead screws 21 allow slider 30 to move smoothly over the guide. Screws 21 also prevent guide 20 from being twisted when arm 40 is used to insert or remove a PC board 55 from card cage 50. The side view of guide 20 shows its T-shaped appearance, with wide section 23 of the T standing out from the card cage when guide 20 is fixed either above or below the PC boards. Wide section 23 of the guide acts as a track for slider 30 to move on.

Slider 30 fits over wide section 23 of guide 20 and also holds arm 40. As shown, slider 30 can fit over either end of guide 20, after arm 40 has been mounted on the slider. Slider 30 has two flanges 32, each flange having a hole 33. Arm 40 also has a pair of flanges 43 having aligned holes 44 which are positioned coaxially with holes 33. Arm 40 is pivotally mounted to slider 30 using a shoulder screw 45 which passes through holes 33 and 44. Arm 40 is biased in the direction of arrow 61 (FIG. 1B) by spring 49. Spring 49 insures that arm 40 remains in a vertical position when it is not being used, so that arm 40 will not protrude from the front of card cage 50 and become damaged by system users, or prevent protective card cage doors (not shown) from closing. Rotating arm 40 has an offset end 71 configured to engage PC boards 55 during insertion and removal. End 71 has a vertical groove 41, the groove being used to align arm 40 with selected PC board 55 during insertion of PC board 55 into card cage 50 as shown in FIG. 1A. End 71 also has an ejection pin 42, extending from one side of end 71, for use during PC board 55 removal, as shown in FIG. 1B.

To insert a PC board 55 using the present invention, PC board 55 is pushed manually into its slot 56 in card cage 50 until the connectors carried by PC board 55 and card cage 50 (not shown) meet. Next, slider 30 with arm 40 attached is moved along guide 20 until groove 41 aligns with the edge of the PC board, as shown in FIG. 1A. To insert PC 55 board fully, a tab 51 of arm 40 is pulled in the direction of arrow 72 (FIG. 1A) until groove 41 comes in contact with PC board 55. Further pulling causes PC board 55 to be pushed further into card cage 50 until the connector parts carried by PC board 55 mate with the corresponding backplane connector parts of card cage 50. Releasing tab 51 allows spring 49 to return arm 40 to its normal, vertical position.

In a similar fashion, when tool 10 is used to remove a PC board from the card cage, slider 30 is moved along guide 20 until arm 40 is to one side, to the right in FIG. 1B, of PC board 55 to be removed. Tab 51 is then lifted a small amount until pin 42 on arm 40 aligns with a slot 74 in PC board 55. Tab 51 is then lifted slightly so that pin 42 will fit into slot 74 on PC board 55. Once pin 42 is in position, pushing down on arm 40 causes the connectors to unmate, and PC board 55 moves in the direction of arrow 75 out from card cage 50. Slider 30 and arm 40 can then be moved out of the way and PC board 55 fully removed.

In operation, arm 40, as shown in FIGS. 1A and 1B, provides the force needed to insert and remove PC boards 55 from card cage 50. Tool 10's geometry provides considerable mechanical advantage in the insertion/removal process by hinging arm 40 about a point near the portion of tool 10 which comes in contact with PC boards 55. By lifting on the lower part of arm 40, a torque is generated which is used to insert or remove PC boards 55.

An alternative embodiment of the present invention is shown in FIG. 3 wherein two tools 10 are used on one card cage 50. One guide is mounted above PC boards 55 and another below PC boards 55. Note that the rotating arms fit between the PC boards when the tools are tilted forward during the ejection process. Arm 40 and slider 30 mounted on the upper guide 20 are, of course, inverted to retain the correct orientation for use. Activating both tools simultaneously will greatly ease the insertion and removal of larger PC boards.

Many other operational variations are readily envisioned. Only one slider/arm combination 30/40 is needed to service a plurality of card cages 50, as long as each card cage has its own guide 20. Combination 30/40 could then be removed from one guide 20 and mounted on another. By mounting guide 20 vertically, card cages which hold PC boards horizontally could be serviced. With slight modifications, tool 10 could be used to insert and remove components other than PC boards 55. For example, arrays of small disk drives are now common and the present invention could be adapted to remove and insert an individual drive from an array of such drives. Given these numerous possible modifications and operational uses, the invention should not be construed in connection with any one embodiment, but rather defined by the broad scope and breadth of the claims.

What is claimed is:

1. A tool for inserting and removing a selected one of a plurality of printed circuit boards of the type removable inserted in a housing that holds the plurality of printed circuit boards in spaced parallel orientation to one another, the housing being of a type formed to define an interior for containing the plurality of printed circuit boards and an opening through which the selected one of the plurality of printed circuit boards is inserted to the interior, the tool comprising:

a guide mounted on the housing proximate the opening, slide means mounted on the guide for sliding movement to a position proximate the selected one of the plurality of printed circuit boards;

an arm pivotally mounted on the slide means, the arm carrying a laterally-extending pin, the arm being movable by the slide means and pivotable between a first position to locate the pin in engagement with an aperture formed in the selected one of the plurality of printed circuit boards to a second position removing the selected one of the plurality of printed circuit boards.

2. The tool of claim 1 wherein two of said tools are mounted on the housing, one tool above and the other below the plurality of printed circuit boards, the two tools cooperating to remove and insert the selected one of the plurality of printed circuit boards from and into the housing.

3. The tool of claim 1, wherein the guide comprises a strip having a T-shaped cross-section.

4. The tool of claim 3 wherein the slide means has a T-shaped channel, the channel being complementary to the cross section of the guide.

5. The tool of claim 1, wherein the aperture formed in the selected one of the plurality of printed circuit boards is a vertically extending, elongate slot.

6. A tool for insertion and removal of a selected one of a number of card elements mounted in a housing, the housing including a plurality of guideways for guiding and supporting the number of card elements, the tool comprising:

a guide mounted to the housing adjacent to the plurality of guideways;

a slide member slidably mounted to the guide for movement between the plurality of guideways;

a pivot arm pivotably mounted to the slide member, the pivot arm including a card engaging end having a card engaging surface configured to engage a first drive surface of the selected one card element to drive the selected one card element into the housing, and a laterally extending element configured to engage a second drive surface of the selected one card element to pull the selected one card element from the housing, the pivot arm being movable between a first position in which the laterally extending element is placed in engagement with the second drive surface to a second position to pull the selected card element from the housing.

7. The tool of claim 6 wherein the card engaging surface is a concave surface.

8. The tool of claim 6 wherein the laterally extending element includes a cylindrical pin.

9. The tool of claim 6 wherein the second drive surface is formed by a vertically extending slot in the card.

10. A tool for inserting and removing a selected one of a plurality of printed circuit boards insertably mounted in a housing in spaced parallel orientation to one another, the housing being of the type having an opening formed for access to an interior in which the plurality of printed circuit boards are mounted, the tool comprising:

guide means mounted on the housing proximate the opening;

a slide element mounted for movement along the guide means to a position proximate the selected one of the plurality of printed circuit boards; and an arm pivotally mounted on the slide means, the arm including a printed circuit board engaging portion from which laterally extends a pin member;

wherein the tool is operable in a first mode in which the slide element is moved to a first location proximate the selected one of the plurality of printed circuit boards, and the arm pivoted between a first position that places the pin element in engagement with an aperture formed in the selected one of the plurality of printed circuit boards to a second position removing the selected one of the plurality of printed circuit boards, and a second mode in which the slide element is moved to a second location proximate the selected one of the plurality of printed circuit boards, and the arm means pivoted between the second position to the first position to insert the selected one of the plurality of printed circuit boards.

* * * * *